US012695396B2

(12) United States Patent (10) Patent No.: US 12,695,396 B2
Nishikimi et al. (45) Date of Patent: Jul. 28, 2026

(54) POWER CONVERSION DEVICE WITH PARTITION FOR COOLING AND NOISE SUPPRESSION

(71) Applicant: HITACHI ASTEMO, LTD., Hitachinaka (JP)

(72) Inventors: Fusanori Nishikimi, Hitachinaka (JP); Takashi Hirao, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 297 days.

(21) Appl. No.: 18/562,411

(22) PCT Filed: Jul. 15, 2021

(86) PCT No.: PCT/JP2021/026696
§ 371 (c)(1),
(2) Date: Nov. 20, 2023

(87) PCT Pub. No.: WO2023/286255
PCT Pub. Date: Jan. 19, 2023

(65) Prior Publication Data
US 2024/0223100 A1 Jul. 4, 2024

(51) Int. Cl.
*H02M 7/537* (2006.01)
*H02M 1/14* (2006.01)
(Continued)

(52) U.S. Cl.
CPC ............. *H02M 7/003* (2013.01); *H02M 1/14* (2013.01); *H02M 7/537* (2013.01); *H05K 7/20927* (2013.01)

(58) Field of Classification Search
CPC .... H02M 7/537; H02M 7/003; H05K 7/1432; H05K 7/20254; H05K 7/20927;
(Continued)

(56) References Cited

U.S. PATENT DOCUMENTS

2003/0067749 A1* 4/2003 Tamba ............... H05K 7/20927
165/80.4
2008/0130223 A1 6/2008 Nakamura et al.
(Continued)

FOREIGN PATENT DOCUMENTS

CN 103907278 A 7/2014
JP 2007-185026 A 7/2007
(Continued)

OTHER PUBLICATIONS

International Search Report with English Translation and Written Opinion dated Oct. 5, 2021 in corresponding International Application No. PCT/JP2021/026696 (8 pages).
(Continued)

*Primary Examiner* — Crystal L Hammond
*Assistant Examiner* — Nusrat Quddus
(74) *Attorney, Agent, or Firm* — Foley & Lardner LLP

(57) ABSTRACT

A power conversion device includes: a semiconductor module in which a semiconductor element is sealed; a drive circuit board on which a drive circuit that drives the semiconductor element is mounted; a control circuit board on which a control circuit that controls the drive circuit is mounted; and a first cooling member that cools the semiconductor module. The power conversion device is divided into a first space and a second space by a partition wall of a housing. The drive circuit board is disposed in the first space so as to face the semiconductor module with the first cooling member interposed between the drive circuit board and the semiconductor module. The control circuit board is disposed in the second space.

9 Claims, 15 Drawing Sheets (A)

(B)

(51) Int. Cl.
  *H02M 7/00* (2006.01)
  *H05K 7/20* (2006.01)

(58) Field of Classification Search
  CPC .......... H05K 4/228; H05K 4/38; H01G 2/04;
      H02K 7/20218; H02G 5/005; H01L
      2924/00; H01L 2924/1305; H01L
      2924/13055; H01L 2924/13091; H01L
      2924/181; H01L 2924/00012; H01L
      2924/00014; H01L 2924/40137; H01L
      2924/0002; H01L 2224/49091; H01L
      2224/48247; H01L 2224/73265; H01L
      2224/48472; H01L 24/33; H01L 24/36;
      H01L 23/473; B60K 6/28; B60K 6/48;
      B60K 1/003; B60Y 2400/112; B60Y
      2400/114; B60L 2240/36; B60L
      2240/421; B60L 2240/423; B60L
      2240/441; B60L 2240/443; B60L
      2210/40; B60L 2270/145; B60L 2220/14;
      B60L 2220/12; B60L 3/003; B60L
      15/007; B60L 15/2009; B60L 11/123;
      B60L 11/14; B60L 11/1861
  See application file for complete search history.

(56) References Cited

U.S. PATENT DOCUMENTS

| | | | | |
|---|---|---|---|---|
| 2010/0025126 | A1* | 2/2010 | Nakatsu | ................. B60L 50/00 361/699 |
| 2012/0188712 | A1* | 7/2012 | Ishibashi | .............. H01L 23/473 361/688 |
| 2012/0300521 | A1* | 11/2012 | Hida | ................. H05K 7/14329 363/131 |
| 2013/0062751 | A1* | 3/2013 | Takagi | ............... H01L 23/4334 257/692 |
| 2013/0075886 | A1 | 3/2013 | Abe et al. | |
| 2013/0265808 | A1* | 10/2013 | Ishii | ........................ H02M 1/12 363/97 |
| 2013/0278194 | A1* | 10/2013 | Numakura | .............. H02P 27/08 318/400.27 |
| 2014/0140119 | A1* | 5/2014 | Shinohara | ............... H01L 24/36 363/141 |
| 2014/0160823 | A1* | 6/2014 | Uetake | ................... H02M 1/44 363/141 |
| 2014/0197532 | A1* | 7/2014 | Ide | ..................... H05K 7/20927 257/706 |
| 2014/0313806 | A1* | 10/2014 | Shinohara | ............ H01L 23/473 363/141 |
| 2015/0029666 | A1* | 1/2015 | Kosuga | ................. H02M 7/003 361/699 |
| 2015/0163962 | A1* | 6/2015 | Suzuki | ................... H02P 27/06 361/699 |
| 2015/0214857 | A1* | 7/2015 | Kosuga | ................. B60L 3/0069 318/400.26 |
| 2015/0256096 | A1* | 9/2015 | Nishizawa | ............. B60L 50/61 361/306.1 |
| 2016/0226392 | A1* | 8/2016 | Kato | ..................... H02M 5/458 |
| 2019/0098777 | A1* | 3/2019 | Nakatsu | ................. B60L 50/00 |
| 2019/0386577 | A1 | 12/2019 | Ishii et al. | |
| 2024/0268086 | A1* | 8/2024 | Nishikimi | ........... H02M 7/5387 |

FOREIGN PATENT DOCUMENTS

| | | | |
|---|---|---|---|
| JP | 2008-118753 | A | 5/2008 |
| JP | 2010-245910 | A | 10/2010 |
| JP | 2013-074669 | A | 4/2013 |
| JP | 2018-121457 | A | 8/2018 |
| WO | WO-2018/179773 | A1 | 10/2018 |

OTHER PUBLICATIONS

Chinese Office Action issued in corresponding Chinese Application No. 202180097690.5, dated Jun. 8, 2026.

\* cited by examiner (B)

POWER CONVERSION DEVICE WITH PARTITION FOR COOLING AND NOISE SUPPRESSION

TECHNICAL FIELD

The present invention relates to a power conversion device.

BACKGROUND ART

A power conversion device using a semiconductor module in which a semiconductor element is sealed has high conversion efficiency, and thus is widely used for consumer use, in-vehicle use, railway use, transformation equipment, and the like. Since this semiconductor element generates heat by energization, it is necessary to cool the semiconductor module. Therefore, in the power conversion device, a cooling member for cooling the semiconductor module is provided in the vicinity of the semiconductor module. In addition, the power conversion device needs to be provided with a drive circuit that drives the semiconductor element and a control circuit that controls the drive circuit. In this case, the drive circuit and the control circuit are required to be disposed so as not to be affected by noise due to a switching operation or the like of the semiconductor element.

PTL 1 discloses a power conversion device in which a control circuit unit is disposed on an uppermost layer inside the power conversion device, a driver circuit board is disposed below the control circuit unit, a power module package is disposed below the driver circuit board, and a flow path forming body is disposed between the power module package and a lower cover under the power module package.

CITATION LIST

Patent Literature

PTL 1: JP 2018-121457 A

SUMMARY OF INVENTION

Technical Problem

In the device of PTL 1, a drive circuit and a control circuit are easily affected by noise due to a switching operation of a semiconductor element or the like.

Solution to Problem

A power conversion device according to the present invention is a power conversion device including: a semiconductor module in which a semiconductor element is sealed; a drive circuit board on which a drive circuit that drives the semiconductor element is mounted; a control circuit board on which a control circuit that controls the drive circuit is mounted; and a first cooling member that cools the semiconductor module. The power conversion device is divided into a first space and a second space by a partition wall of a housing. The drive circuit board is disposed in the first space so as to face the semiconductor module with the first cooling member interposed between the drive circuit board and the semiconductor module. The control circuit board is disposed in the second space.

Advantageous Effects of Invention

According to the present invention, it is possible to suppress the influence of noise due to the switching operation of the semiconductor element on the drive circuit and the control circuit.

BRIEF DESCRIPTION OF DRAWINGS

FIGS. 4(A) and 4(B) are diagrams illustrating a semiconductor module before a control terminal is bent.

FIGS. 12(A) and 12(B) are diagrams of a power conversion device illustrating a modification of a flow path.

FIGS. 13(A) and 13(B) are diagrams illustrating installation modes 1 and 2 of a current sensor.

FIG. 15 is a circuit configuration diagram of the power conversion device.

DESCRIPTION OF EMBODIMENTS

Figure 1:
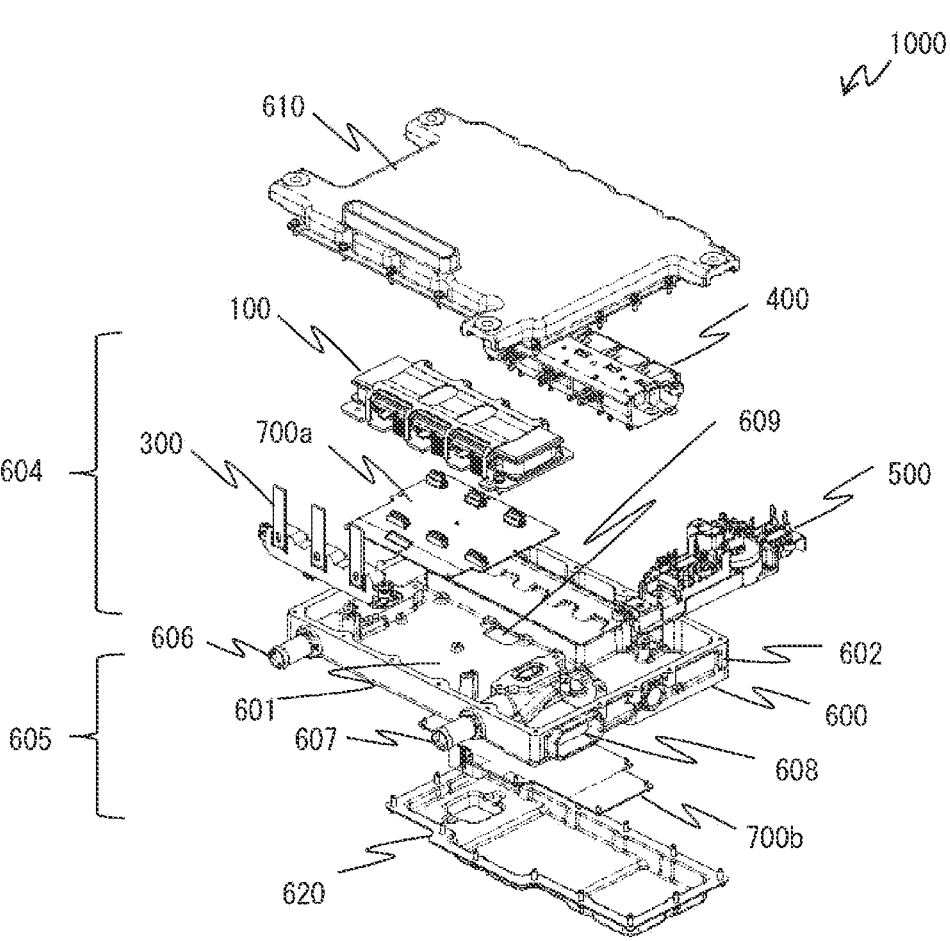
FIG. 1 is an exploded perspective view of a power conversion device.

Hereinafter, embodiments of the present invention will be described with reference to the drawings. The following description and drawings are exemplifications for describing the present invention, and are omitted and simplified as appropriate for clarification of the description. The present invention can be implemented in other various forms. Unless otherwise limited, each component may be singular or plural.

The position, size, shape, range, and the like of each component illustrated in the drawings may not necessarily represent the actual position, size, shape, range, and the like, in order to facilitate understanding of the invention. For this reason, the present invention is not necessarily limited to the position, size, shape, range, and the like disclosed in the drawings.

When there are a plurality of components having the same or similar functions, different subscripts may be given for the same reference numerals for explanation. However, when there is no need to distinguish between these components, the description may be omitted with subscripts omitted.

FIG. 1 is an exploded perspective view of a power conversion device 1000 according to the present embodiment. The power conversion device 1000 is divided into a first space 604 and a second space 605 by a partition wall 601 of a housing 600. The housing 600 includes a partition wall 601 and a side wall 602 formed around the partition wall 601, and is closed by a lower cover 610 and an upper cover 620.

Although details will be described later, the cooling structure of the semiconductor module includes a semiconductor module 100 and first and second cooling members 110 and 120 (see FIG. 3(A)) disposed on both surfaces of the semiconductor module 100. The semiconductor module 100 having such a cooling structure is installed in the first space 604. In the first space 604, an AC bus bar 300, a smoothing capacitor 400, an electromagnetic compatibility (EMC) filter 500, and a drive circuit board 700a are further installed.

In the first space 604, the drive circuit board 700a is disposed facing the semiconductor module 100 with the first cooling member 110 interposed therebetween, and further, the smoothing capacitor 400 is disposed on a side portion of the semiconductor module 100 and the drive circuit board 700a.

In the second space 605, a control circuit board 700b is disposed at a position facing the smoothing capacitor 400 across the partition wall 601 when viewed from a direction perpendicular to the partition wall 601 of the housing 600. At least a partial region of the control circuit board 700b is disposed at a position overlapping the drive circuit board 700a in a direction perpendicular to the main surface of the control circuit board 700b, and a wiring hole 609 through which a connection wiring passes between the control circuit board 700b and the drive circuit board 700a is formed in the partition wall 601 in the overlapping region. The partition wall 601 facing the drive circuit board 700a other than the partition wall 601 in the overlapping region forms an outer wall of the housing 600.

A seal ring or a liquid seal is provided between the side wall 602 of the housing 600 and the lower cover 610 and the upper cover 620 to ensure internal airtightness of the power conversion device 1000. The lower cover 610, the upper cover 620, and the housing 600 are mainly made of conductive metal, but other materials may be used.

The semiconductor module 100 is connected to a battery (not illustrated) via the smoothing capacitor 400 and the EMC filter 500, and DC power is supplied from the battery. In addition, the semiconductor module 100 converts DC power into AC power by switching a semiconductor element sealed in the semiconductor module 100. The DC power is supplied from the battery via a DC input unit 608. The converted AC power and the AC current output from the semiconductor module 100 are connected to the AC bus bar 300 via an output line. The AC bus bar 300 is connected to a motor (not illustrated), and drives the motor by the output AC current. Note that a current sensor (not illustrated) is disposed near the output lines of the semiconductor module 100 and the AC bus bar 300.

The capacitor element of the smoothing capacitor 400 is a capacitor element formed of a wound film or the like, has a function of storing charges, and is sealed and fixed with a filler or the like inside a case made of a material such as plastic. The terminal of the smoothing capacitor 400 is a member having a shape such as a round bar or a flat plate formed of a conductive material such as copper, for example, and electrically connects the capacitor element and the external DC bus bar. In the present embodiment, the flat terminal is formed to be exposed from the filling and sealing surface so as to be substantially parallel to the upper surface of the capacitor element.

A control terminal of the semiconductor element led out from the semiconductor module 100 is connected to the drive circuit board 700a. Electronic components constituting a drive circuit that drives a semiconductor element are mounted on the drive circuit board 700a. The drive circuit inputs a control signal to a control terminal of the semiconductor element to cause the semiconductor element to perform switching operation. The refrigerant flows through the first and second cooling members 110 and 120 disposed on both surfaces of the semiconductor module 100, and the refrigerant is input to and output from an inlet flow path 606 and an outlet flow path 607 provided in the side wall 602 of the housing 600.

Figure 2:
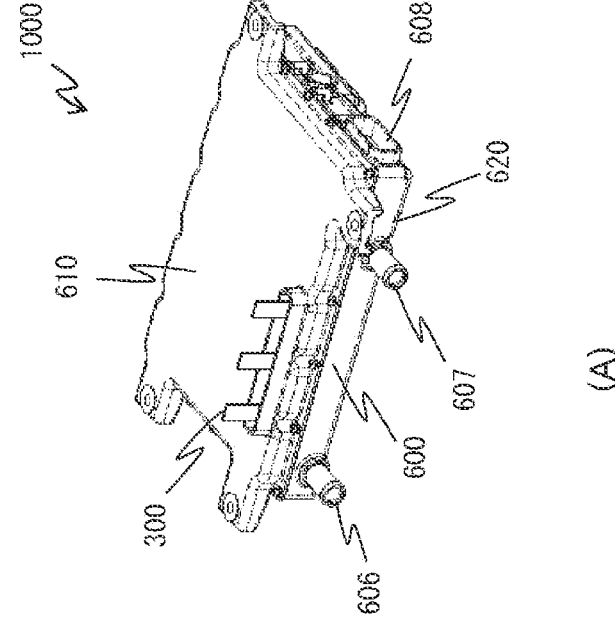
FIGS. 2(A) and 2(B) are perspective views of the power conversion device.

FIGS. 2(A) and 2(B) are perspective views of the power conversion device 1000. FIG. 2(A) is a perspective view of the power conversion device 1000 as viewed from below, and FIG. 2(B) is a perspective view of the power conversion device 1000 as viewed from above.

As illustrated in FIG. 2(A), the AC bus bar 300 protrudes from the lower cover 610 of the power conversion device 1000 and is connected to a motor (not illustrated). Attachment holes for fixing the power conversion device 1000 to a motor or the like with screws are provided at four corners of the lower cover 610.

As illustrated in FIG. 2(B), one of the signal connectors 710 protrudes from the upper cover 620 of the power conversion device 1000 and is connected to an external control device (not illustrated). The other of the signal connectors 710 is connected to an electronic component such as a controller disposed on the control circuit board 700b. Although one of the signal connectors 710 protrudes from the upper cover 620, the signal connector may protrude from between the upper cover 620 and the side wall 602 of the housing 600.

Figure 3:
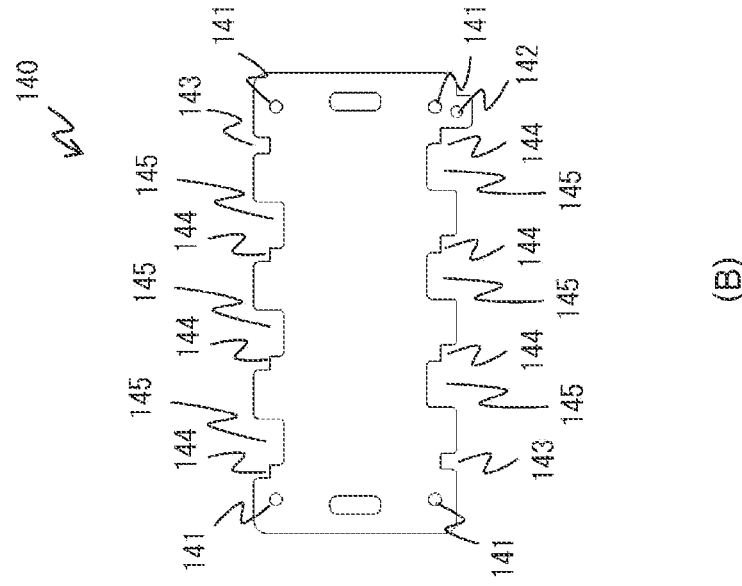
FIGS. 3(A) and 3(B) are exploded perspective views illustrating a cooling structure of a semiconductor module.
Figure 3:
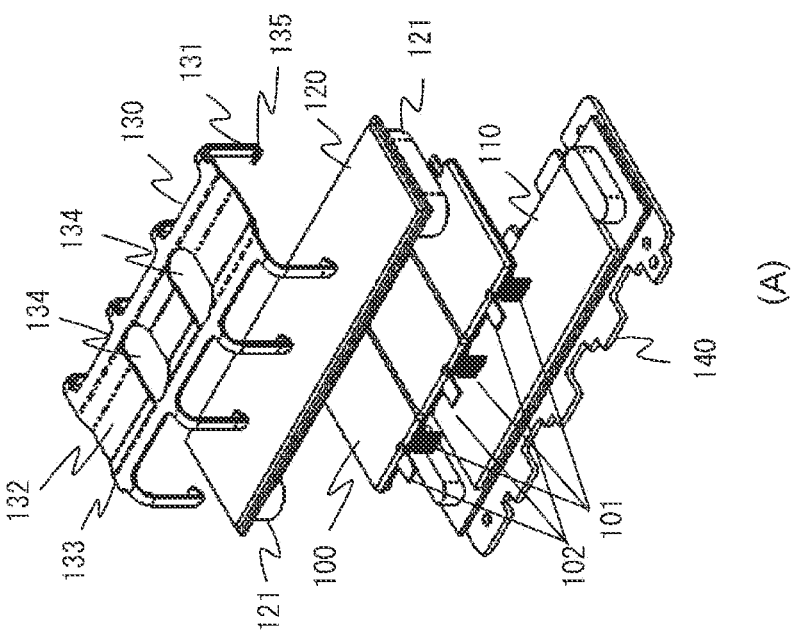

FIGS. 3(A) and 3(B) are exploded perspective views illustrating the cooling structure of the semiconductor module 100 according to the present embodiment. FIG. 3(A) is an exploded perspective view illustrating the cooling structure, and FIG. 3(B) is a plan view of a base plate 140.

As illustrated in FIG. 3(A), the cooling structure of the semiconductor module 100 includes a semiconductor module 100, first and second cooling members 110 and 120 disposed on both surfaces of the semiconductor module 100, a base plate 140 facing the semiconductor module 100 with the first cooling member 110 interposed therebetween, and a spring plate member 130 pressing the second cooling member 120 toward the semiconductor module 100.

The semiconductor module 100 is formed by sealing a semiconductor element, and in the present embodiment, an example in which three semiconductor modules are arranged in parallel will be described, but the number of semiconductor modules is an example. Note that a plurality of arranged semiconductor modules may be collectively referred to as a semiconductor module 100.

The first and second cooling members 110 and 120 are in close contact with both surfaces of the semiconductor module 100 via a thermal conductive member such as thermal conductive grease or a heat dissipation sheet, and the semiconductor module 100 is cooled by the refrigerant flowing inside the first and second cooling members 110 and 120.

From the semiconductor module 100, a control terminal 101 for inputting a control signal and an AC terminal 102 connected to the AC bus bar 300 are led out. The control terminal 101 is connected to the drive circuit board 700a across the first cooling member 110. A DC terminal connected to the DC bus bar is led out on the opposite side of the AC terminal 102, and the DC bus bar is connected to the smoothing capacitor 400 and the EMC filter 500.

In the spring plate member 130, a plurality of leg portions 131 are integrally formed. The plurality of leg portions 131 extend to both side surfaces of the second cooling member 120, the semiconductor module 100, and the first cooling member 110, and are locked to the end portion of the base plate 140. As a result, the spring plate member 130 presses the second cooling member 120 toward the semiconductor module 100. In other words, the second cooling member 120, the semiconductor module 100, and the first cooling member 110 are pressed between the spring plate member 130 and the base plate 140. Two openings 134 are formed in a central portion of the spring plate member 130. The first cooling member 110 and the second cooling member 120 are connected by a water path connection portion 121. As described later, the inlets of the first and second cooling members 110 and 120 are connected to a third flow path for guiding the refrigerant flowing in from the inlet flow path 606, and the outlets of the first and second cooling members 110 and 120 are connected to a fourth flow path for guiding the refrigerant to the outlet flow path 607.

FIG. 3(B) is a top view of the base plate 140.

The base plate 140 has attachment holes 141 into which screws are inserted at four corners. A screw is passed through the attachment hole 141 to fix the structure including the integrated semiconductor module 100 and the first and second cooling members 110 and 120 to the drive circuit board 700a.

The base plate 140 has a positioning hole 142. The positioning hole 142 is used as positioning for fitting a protruding portion provided on the drive circuit board 700a and the positioning hole 142 when the structure is fixed to the housing 600.

In the present embodiment, one leg portion 131 is formed from each of the four corners of the spring plate member 130, and a total of four leg portions 131 are integrally formed on both side surfaces of the semiconductor module 100 by extending toward the base plate 140 at predetermined intervals along the arrangement direction of the semiconductor modules 100. Each leg portion 131 is formed at a predetermined interval at a position separated from the control terminal 101, the AC terminal 102, and the DC terminal derived from the semiconductor module 100 and maintaining an insulation distance.

The base plate 140 has two first locking portions 143 and six second locking portions 144 which are locked to a clip portion 135 provided at the tip of the leg portion 131 of the spring plate member 130. The first locking portion 143 locks and positions the clip portion 135 of the leg portion 131 of the spring plate member 130, has a U-shape corresponding to the cross-sectional shape of the leg portion 131, and is disposed at two diagonal positions of the base plate 140. The second locking portion 144 is locked to the clip portion 135 of the leg portion 131 of the spring plate member 130. In addition, the base plate 140 is provided with a control terminal opening 145 in order to pass the control terminal 101 led out from the semiconductor module 100 toward the drive circuit board 700a.

The spring plate member 130 includes a pressurizing portion 132 that abuts on the second cooling member 120 and a bent portion 133 that connects the pressurizing portion 132 and the leg portion 131. The pressurizing portion 132 is formed at the central portion of the spring plate member 130 along the arrangement direction of the semiconductor modules 100. The bent portion 133 is formed on both sides of the central portion of the spring plate member 130 along the arrangement direction of the semiconductor modules 100. The pressurizing portion 132 at the central portion of the spring plate member 130 protrudes toward the central portion of the second cooling member 120 and abuts on the central portion of the second cooling member 120. The bent portions 133 located on both sides of the central portion of the spring plate member 130 are separated from both sides of the central portion of the second cooling member 120. The tip of the leg portion 131 is bent to form a clip portion 135.

The spring plate member 130 is formed of a material such as stainless steel, and when an external force is applied, a restoring force acts to generate a pressing force. The pressurizing portion 132 of the spring plate member 130 abuts on and presses the central portion of the second cooling member 120 to lock the clip portion 135 of the leg portion 131 of the spring plate member 130 to the base plate 140. Then, the second cooling member 120, the semiconductor module 100, the first cooling member 110, and the base plate 140 are brought into pressure contact with each other by the pressing force of the bent portion 133.

The central portion of the second cooling member 120 is uniformly pressed by the pressurizing portion 132 at the central portion of the spring plate member 130 along the arrangement direction of the semiconductor modules 100, and a surface pressure is applied to the central portion of the semiconductor modules 100. By applying the surface pressure to the central portion, the first and second cooling members 110 and 120 can be uniformly pressed against both surfaces of the semiconductor module 100. As a result, adhesion to a thermal conductive member such as thermal conductive grease applied to both surfaces of the semiconductor module 100 is increased, and cooling performance for the semiconductor module 100 can be favorably maintained. Since the spring plate member 130 having the pressurizing portion 132 and the bent portion 133 can be configured to have a small thickness, the cooling structure can be downsized. Furthermore, since the leg portion 131 has a thin plate shape integrally formed with the spring plate member 130, the leg portion can be disposed along the side surface of the semiconductor module 100, and the cooling structure can be downsized.

Figure 4:
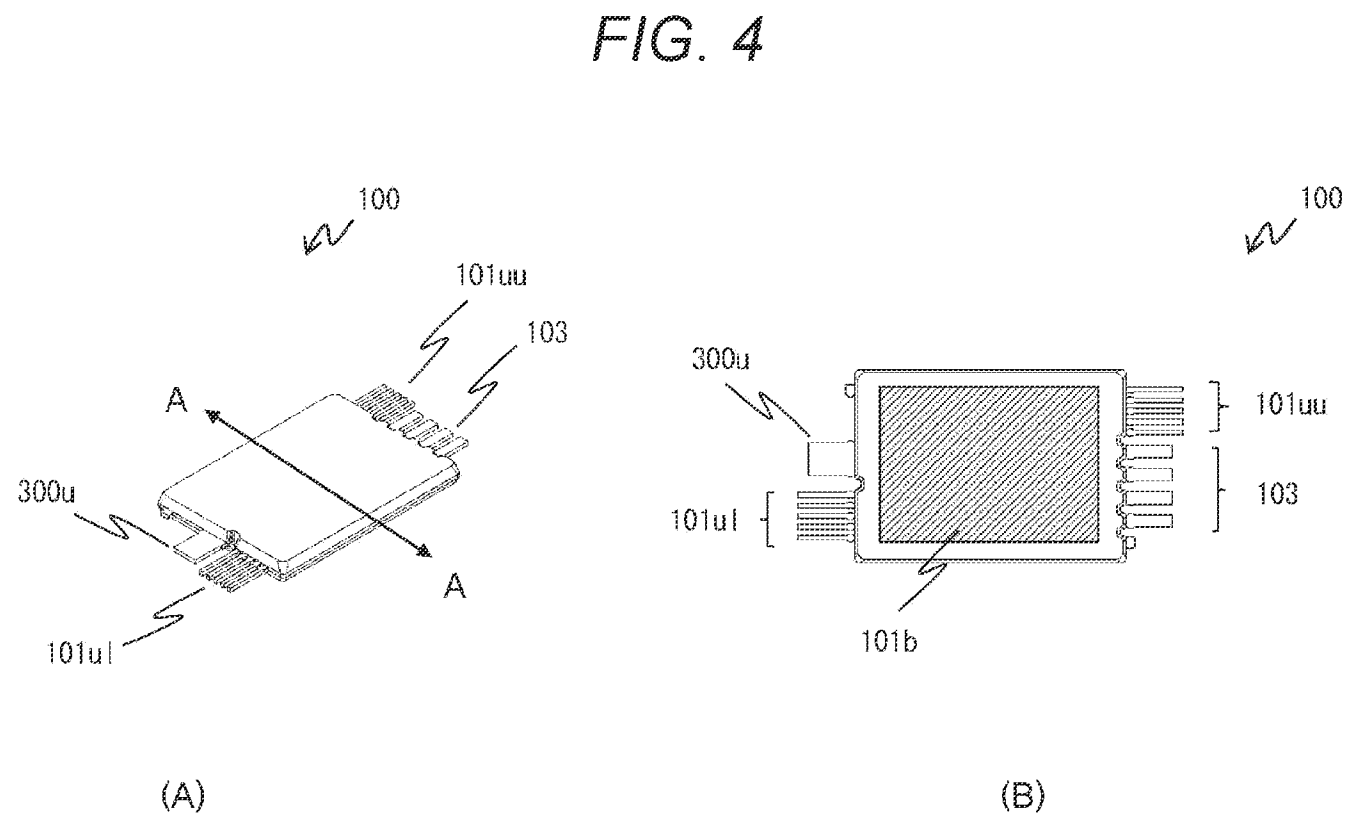

FIGS. 4(A) and 4(B) are diagrams illustrating one semiconductor module 100 before the control terminal 101 is bent. FIG. 4(A) is an external perspective view, and FIG. 4(B) is a top view.

Although one semiconductor module 100 is illustrated in FIG. 4(A), three semiconductor modules 100 are disposed adjacent to each other in the arrangement direction A. One of the semiconductor modules 100 is configured by, for example, connecting two semiconductor elements corresponding to the U-phase upper and lower arms in series. The semiconductor element is made of, for example, an IGBT or a diode. The other two semiconductor modules 100 are semiconductor elements corresponding to the upper and lower arms of the V phase and the W phase.

As illustrated in FIG. 4(A), in the semiconductor module 100 before the plurality of control terminals 101 are bent, a U-phase AC terminal 300u and DC terminals 103 connected to both ends of the upper and lower arms are led out straight to opposite sides in the horizontal direction along the surface of the semiconductor module 100 orthogonal to the arrangement direction A. Further, control terminals 101uu and 101ul respectively connected to the gate electrodes of the two semiconductor elements are led out straight to opposite sides. Each of the control terminals 101uu and 101ul has a plurality of control terminals.

FIG. 4(B) is a top view of one semiconductor module 100, but the upper surface of the semiconductor module 100 has a cooling surface 101b for cooling the semiconductor element that has generated heat, and the second cooling member 120 is in close contact with the cooling surface 101b via a thermal conductive member. Although not illustrated, the lower surface of the semiconductor module 100 similarly has a cooling surface 101a, and the first cooling member 110 is in close contact with the cooling surface 101a via a thermal conductive member.

Figure 5:
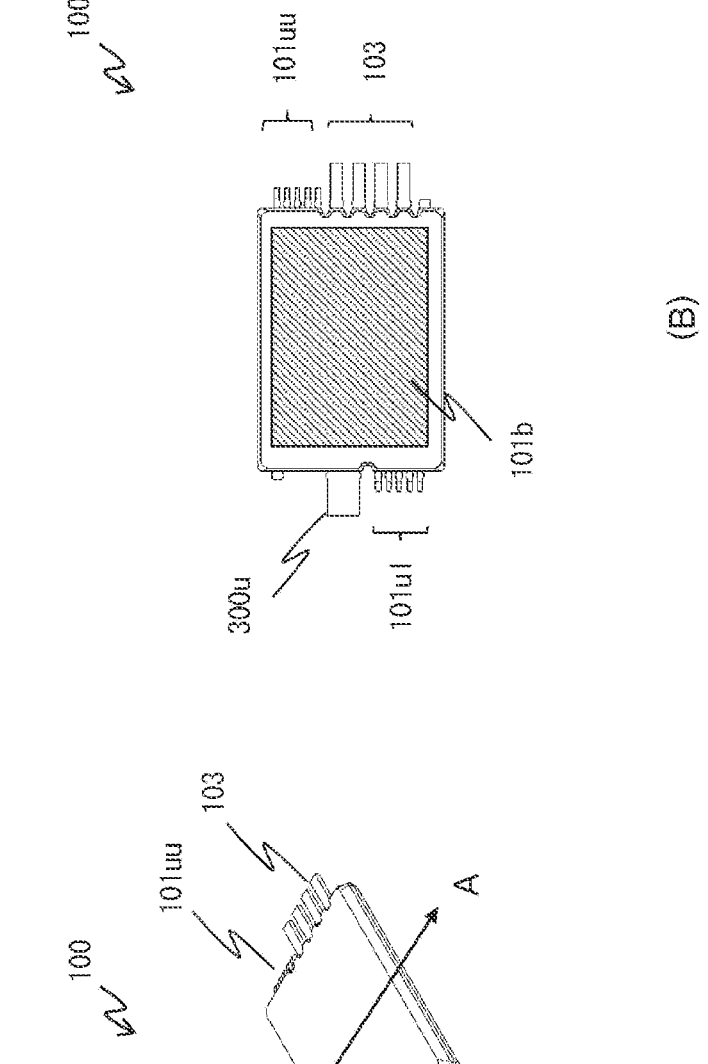
FIGS. 5(A) and 5(B) are diagrams illustrating the semiconductor module after the control terminal is bent.

FIGS. 5(A) and 5(B) are diagrams illustrating one semiconductor module 100 after the control terminal 101 is bent. FIG. 5(A) is an external perspective view, and FIG. 5(B) is a top view. The same portions as those in FIGS. 4(A) and 4(B) are denoted by the same reference numerals, and the description thereof will be simplified.

The control terminals 101uu and 101ul are bent downward in the drawing from the horizontal direction illustrated in FIGS. 4(A) and 4(B) in order to connect to the drive circuit board 700a across the first cooling member 110. As a result, as illustrated in FIGS. 5(A) and 5(B), the plurality of control terminals 101 are bent downward and connected to the drive circuit board 700a.

Figure 6:
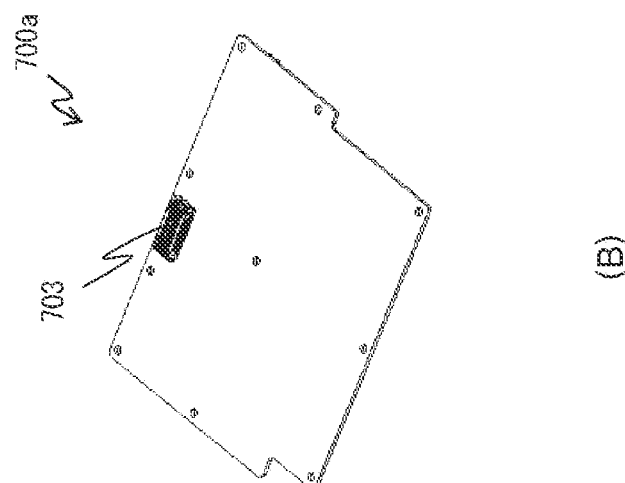
FIGS. 6(A) and 6(B) are perspective views of a drive circuit board.
Figure 6:
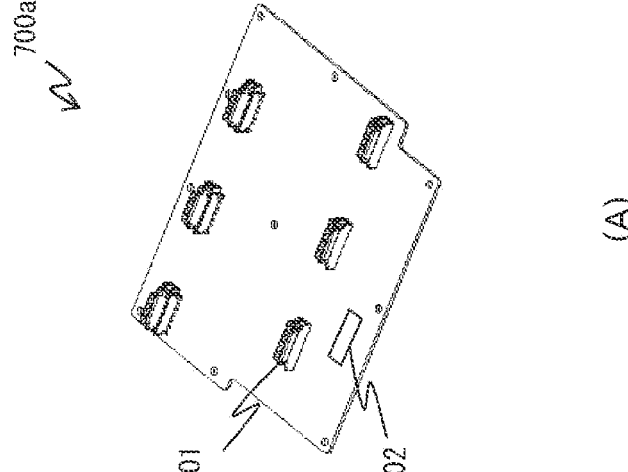

FIGS. 6(A) and 6(B) are perspective views of the drive circuit board 700a. FIG. 6(A) is a perspective view of a front surface, and FIG. 6(B) is a perspective view of a back surface. The arrangement of the connectors is illustrated, and wiring patterns and electronic components on the drive circuit board 700a are not illustrated.

As illustrated in FIG. 6(A), on the surface of the drive circuit board 700a, six control connectors 701 to which the control terminals 101 of the semiconductor module 100 are connected are provided corresponding to the positions of the control terminals 101 of the semiconductor module 100. Further, a signal connector 702 to which a signal line for deriving a detection signal from a current sensor disposed in the vicinity of the output line between the semiconductor module 100 and the AC bus bar 300 is connected is provided on the surface of the drive circuit board 700a.

As illustrated in FIG. 6(B), a control connector 703 to which a control line between the drive circuit board 700a and the control circuit board 700b is connected is provided on the back surface of the drive circuit board 700a. The drive circuit board 700a is fixed to the partition wall 601 with screws or the like, and the drive circuit board 700a has a plurality of holes for the fixing at the periphery and the central portion of the drive circuit board 700a.

Figure 7:
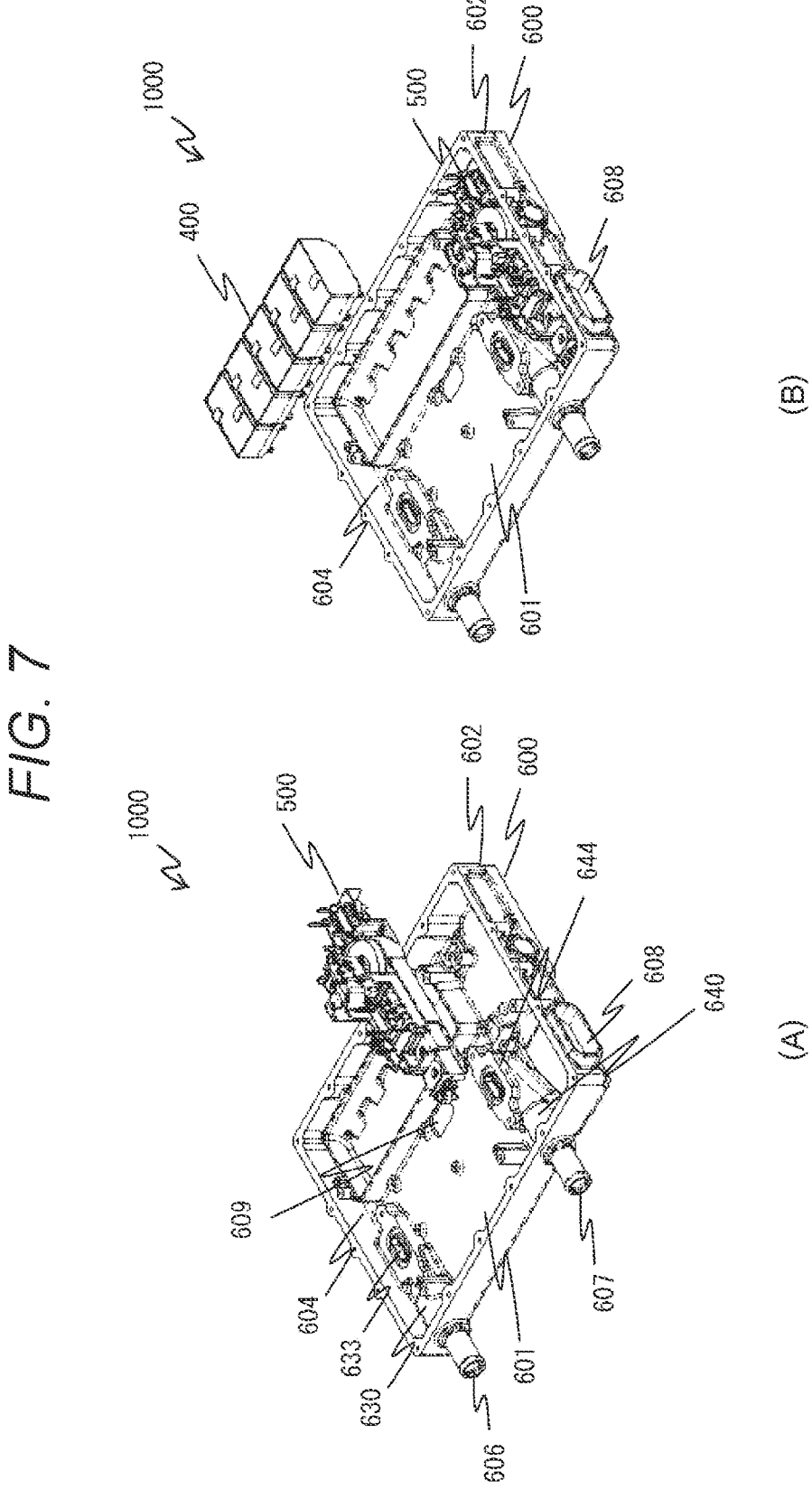
FIGS. 7(A) and 7(B) are diagrams illustrating assembly processes of the power conversion device.

FIGS. 7(A) and 7(B) are diagrams illustrating assembly processes of the power conversion device 1000. FIG. 7(A) illustrates a first step, and FIG. 7(B) illustrates a second step.

In the first process illustrated in FIG. 7(A), the EMC filter 500 is disposed in the first space 604. If necessary, potting is performed between the EMC filter 500 and the housing 600 in order to improve cooling performance. Potting is processing of applying and curing a transparent polyurethane resin obtained by chemically reacting a polyol as a main agent with an isocyanate as a curing agent.

The partition wall 601 includes a third flow path 630 that guides the refrigerant flowing from the inlet flow path 606 to the inlets 633 of the first and second cooling members 110 and 120, and a fourth flow path 640 that guides the refrigerant from the outlets 644 of the first and second cooling members 110 and 120 to the outlet flow path 607. That is, the third flow path 630 has a recess formed in the partition wall 601, and is formed between the recess and the flow path cover 631 (see FIG. 10). Similarly, the fourth flow path 640 has a recess formed in partition wall 601, and is formed between this recess and flow path cover 631. The wiring hole 609 is formed in the partition wall 601.

In the second step illustrated in FIG. 7(B), the smoothing capacitor 400 is disposed in the first space 604. If necessary, potting is performed between the smoothing capacitor 400 and the housing 600 in order to improve cooling performance.

Figure 8:
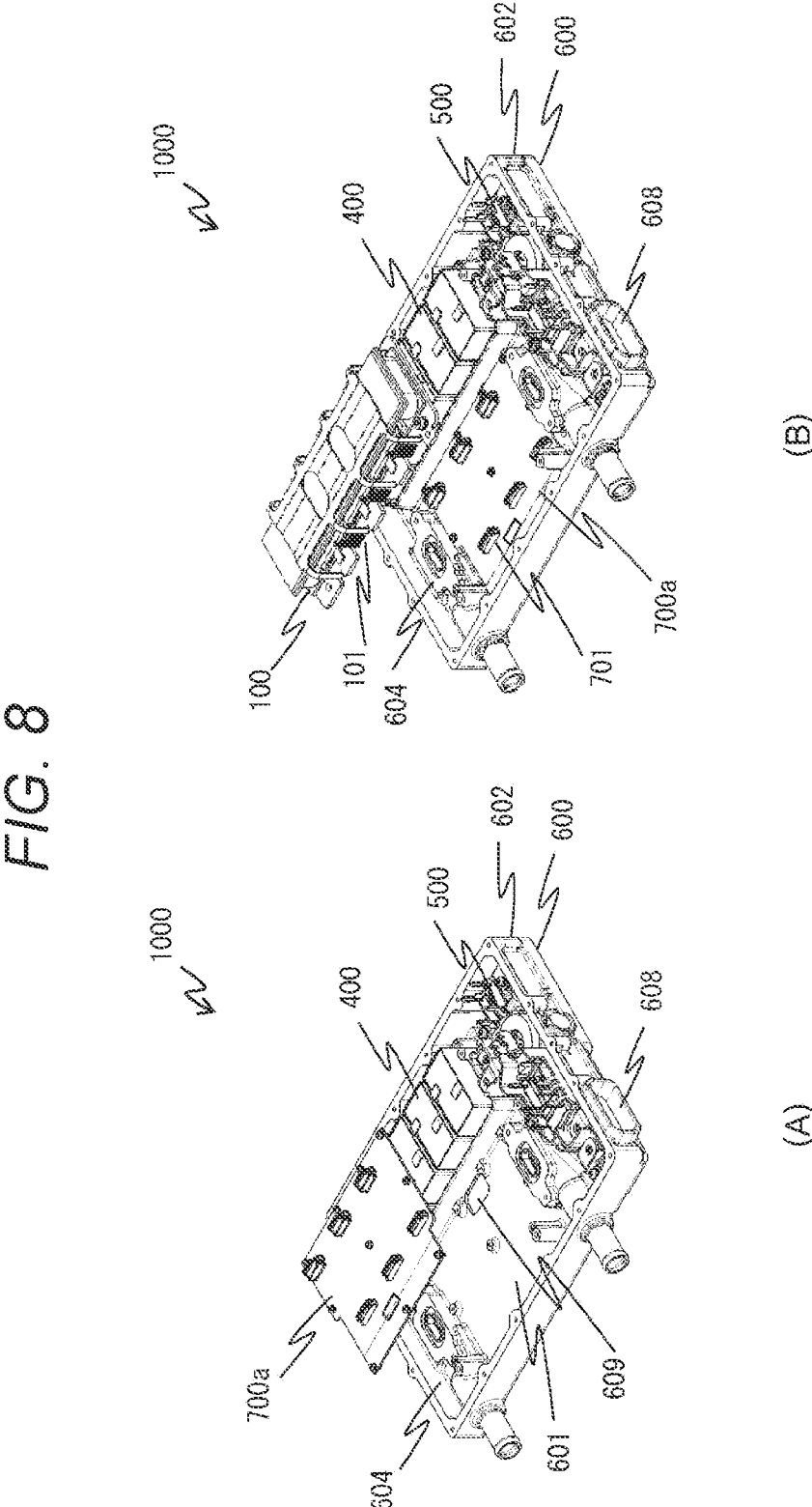
FIGS. 8(A) and 8(B) are diagrams illustrating assembly processes of the power conversion device.

FIGS. 8(A) and 8(B) are diagrams illustrating assembly processes of the power conversion device 1000. FIG. 8(A) illustrates a third and FIG. 8(B) step, illustrates a fourth step.

In the third step illustrated in FIG. 8(A), the drive circuit board 700a is disposed in the first space 604. Specifically, screws are inserted into screw holes provided at a plurality of places around and at the central portion of the drive circuit board 700a to fix the drive circuit board to the partition wall 601. Since the drive circuit board 700a is directly fixed to the partition wall 601 constituting the housing 600 with screws or the like, the rigidity of the drive circuit board 700a can be maintained high as compared with a case where the drive circuit board is fixed with another component interposed therebetween. Therefore, it is possible to reduce shake, deformation, and the like with respect to an external force such as vibration. The control connector 703 provided on the back surface of the drive circuit board 700a is connected to the control circuit board 700b via the wiring hole 609.

In the fourth step illustrated in FIG. 8(B), the semiconductor module 100 is disposed in the first space 604. Screws are inserted into the attachment holes 141 provided at the four corners of the base plate 140 of the semiconductor module 100 to fix the structure including the integrated semiconductor module 100 and the first and second cooling members 110 and 120 to the drive circuit board 700a. Then, the control terminal 101 led out from the semiconductor module 100 is connected to the six control connectors 701 provided on the drive circuit board 700a.

Figure 9:
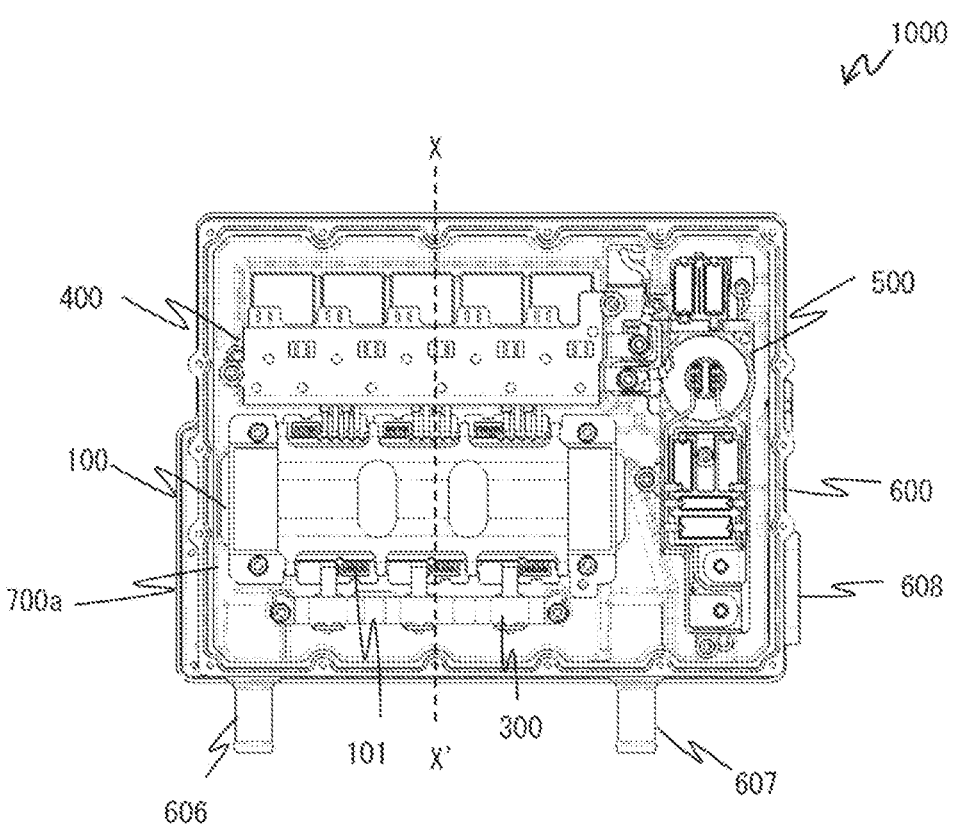
FIG. 9 is a bottom view of the power conversion device as viewed from below.

FIG. 9 is a bottom view of the power conversion device 1000 as viewed from below, and illustrates a state in which the lower cover 610 is removed.

Through the first to fourth steps described above, the EMC filter 500, the smoothing capacitor 400, the semiconductor module 100, the drive circuit board 700a, and the AC bus bar 300 are installed in the first space 604 of the housing 600, and the terminals thereof are connected by welding or the like. The refrigerant flows into the first and second cooling members 110 and 120 disposed on both surfaces of the semiconductor module 100 from the inlet flow path 606, passes through the first and second cooling members 110 and 120, and cools the semiconductor module 100 from both surfaces. Then, the refrigerant flows out of the outlet flow path 607, flows in again from the inlet flow path 606, and is circulated by a pump (not illustrated).

The drive circuit board 700a is affected by noise due to a switching operation or the like of a semiconductor element in the semiconductor module 100, but the first cooling member 110 exists between the drive circuit board 700a and the semiconductor module 100. The first cooling member 110 can also serve as a noise shielding plate, and the influence of noise can be suppressed. Further, an additional component as such a shielding plate is unnecessary, which leads to cost reduction. In addition, since the upper and lower sides of the drive circuit board 700a are sandwiched between the first cooling member 110 and the partition wall 601 of the housing 600, and the periphery is surrounded by the third flow path 630 and the fourth flow path 640 (see FIG. 7(A)), the drive circuit board 700a is hardly affected by the semiconductor module 100 and other heat generating components, and it is possible to suppress an increase in temperature of the electronic components on the drive circuit board 700a.

Figure 10:
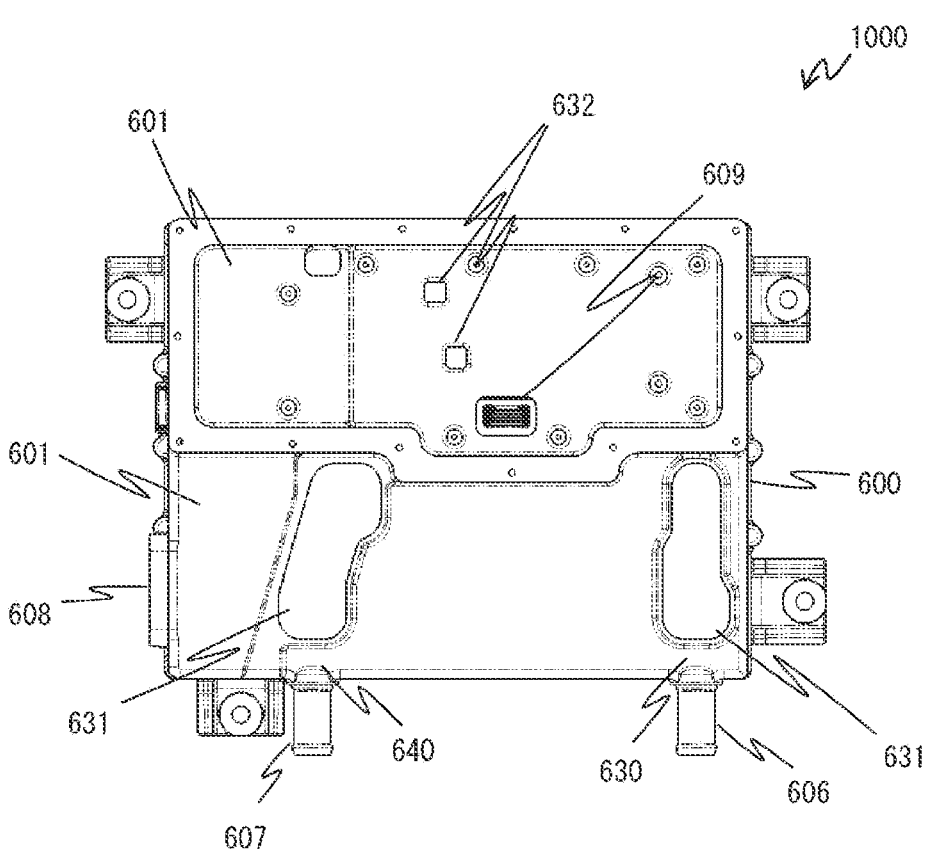
FIG. 10 is a top view of the power conversion device as viewed from above.

FIG. 10 is a top view of the power conversion device 1000 as viewed from above, and illustrates a state in which the upper cover 620 and the control circuit board 700*b* under the upper cover are removed.

As illustrated in FIG. 10, the third flow path 630 and the fourth flow path 640 are formed in the partition wall 601 of the housing 600. The third flow path 630 forms a recess in the partition wall 601, and is formed between the recess and the flow path cover 631. Similarly, the fourth flow path 640 has a recess formed in partition wall 601, and is formed between this recess and flow path cover 631. The flow path cover 631 and the partition wall 601 are joined by friction stir welding. A structure in which the flow path cover 631 is screwed using a general seal ring or a liquid seal may be adopted.

The partition wall 601 is provided with a cooling seat 632 for the control circuit board 700*b*. When the control circuit board 700*b* is fixed to the partition wall 601 with screws or the like, the cooling seat 632 and the control circuit board 700*b* come into contact with each other to cool the electronic components disposed on the control circuit board 700*b* via the cooling seat 632. Since the third flow path 630 and the fourth flow path 640 are formed in the partition wall 601, the partition wall 601 is cooled, and cooling heat can be transferred to the control circuit board 700*b* via the cooling seat 632 provided in the partition wall 601.

Although not illustrated, the control circuit board 700*b* is fixed to the partition wall 601 with screws or the like on the partition wall 601. Since the control circuit board 700*b* is directly fixed to the partition wall 601 constituting the housing 600 with screws or the like, the rigidity of the control circuit board 700*b* can be maintained high as compared with a case where the control circuit board is fixed with another component interposed therebetween. Therefore, it is possible to reduce shake, deformation, and the like with respect to an external force such as vibration. The control connector 703 provided on the back surface of the drive circuit board 700*a* is connected to the control circuit board 700*b* via the wiring hole 609. The detection signal from the current sensor input to the signal connector 702 of the drive circuit board 700*a* is connected to the control connector 703 via the wiring pattern on the drive circuit board 700*a*, and is transmitted from the control connector 703 to the control circuit board 700*b*.

The control circuit board 700*b* is separated from the high-voltage semiconductor module 100 and the drive circuit board 700*a* with the partition wall 601 of the housing 600 interposed therebetween. Further, the control circuit board 700*b* is disposed at a position facing the smoothing capacitor 400 across the partition wall 601, that is, at a position separated from the semiconductor module 100 and the drive circuit board 700*a* in the horizontal direction along the partition wall 601 when viewed from the direction perpendicular to the partition wall 601 of the housing 600. The electronic components on the control circuit board 700*b* are easily affected by noise due to the switching operation or the like of the semiconductor element, but since the partition wall 601 of the housing 600 also serves as a shielding plate for shielding noise, the influence of noise due to the switching operation or the like can be suppressed. Furthermore, since the control circuit board 700*b* is disposed at a position separated from the positions of the semiconductor module 100 and the drive circuit board 700*a* in the horizontal direction along the partition wall 601, the influence of noise can be suppressed.

Figure 11:
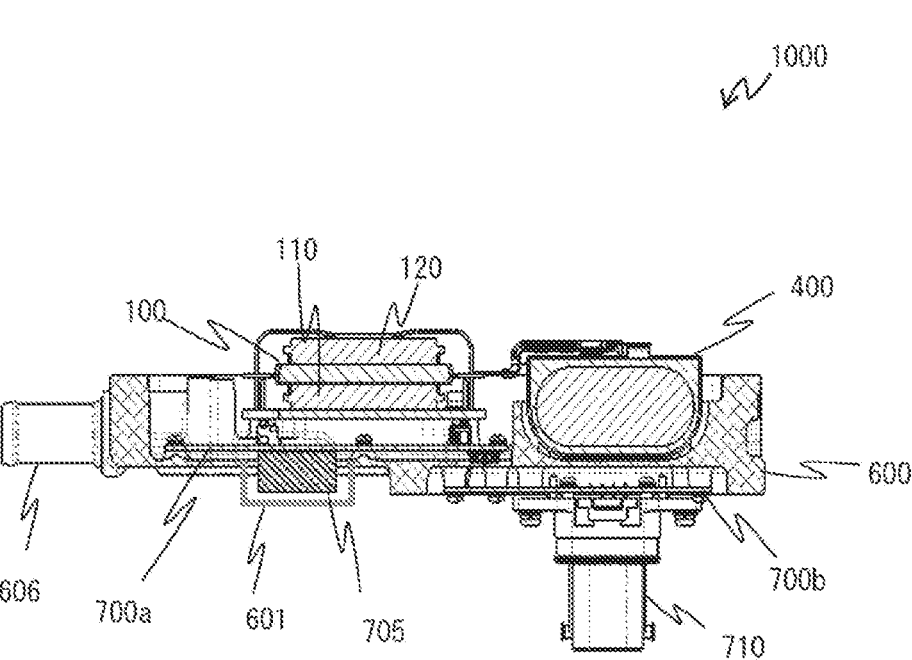
FIG. 11 is a cross-sectional view of the power conversion device illustrating a modification of a partition wall.

FIG. 11 is a cross-sectional view of the power conversion device 1000 illustrating a modification of the partition wall 601. This cross-sectional view corresponds to a cross section taken along line X-X' illustrated in FIG. 9.

When it is necessary to install a tall electronic component, for example, a transformer 705 for voltage conversion on the drive circuit board 700*a*, the transformer 705 is disposed on a surface of the drive circuit board 700*a* opposite to the first cooling member 110. In this case, a protrusion that accommodates the transformer 705 in the first space 604 is formed on the partition wall 601 of the housing 600. The protrusion is formed so as to cover the transformer 705 according to the height of the transformer 705.

Figure 12:
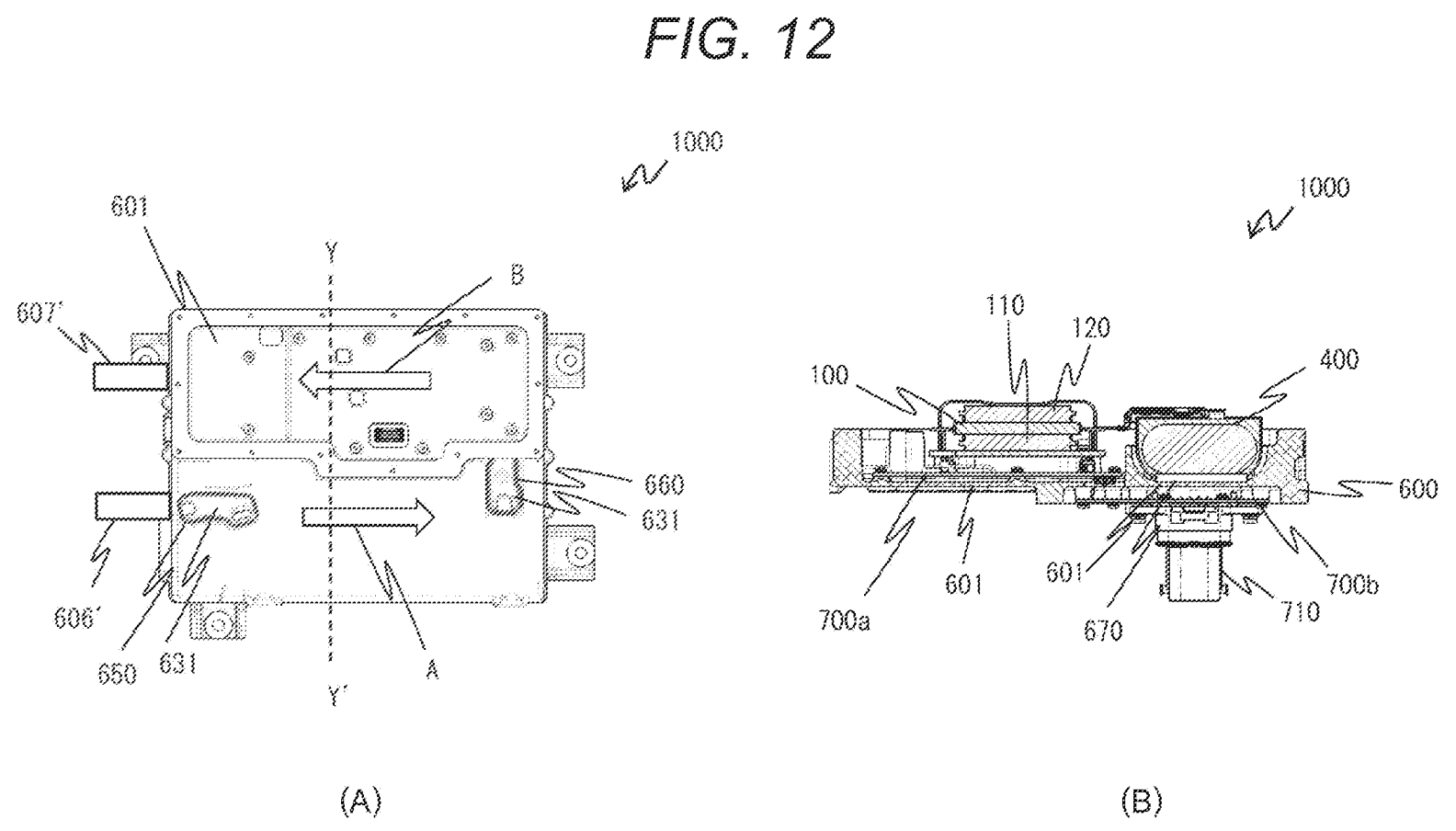

FIGS. 12(A) and 12(B) are diagrams of the power conversion device 1000 illustrating a modification of the flow path. FIG. 12(A) is a top view of the power conversion device 1000 as viewed from above, and illustrates a state in which the upper cover 620 and the control circuit board 700*b* under the upper cover are removed. FIG. 12(B) is a cross-sectional view of the power conversion device 1000, and is a cross section taken along line Y-Y' illustrated in FIG. 12(A). This modification is characterized in that a seventh flow path 670 (third cooling member) for cooling the smoothing capacitor 400 is provided.

As illustrated in FIG. 12(A), a fifth flow path 650 that guides the refrigerant flowing in from an inlet flow path 606' to the inlets 633 of the first and second cooling members 110 and 120, and a sixth flow path 660 that guides the refrigerant from the outlets 644 of the first and second cooling members 110 and 120 to the seventh flow path 670 are formed. As illustrated in FIG. 12(B), the seventh flow path 670 is provided between the smoothing capacitor 400 and the partition wall 601. The fifth flow path 650 forms a recess in the partition wall 601, and is formed between the recess and the flow path cover 631. Similarly, the sixth flow path 660 forms a recess in the partition wall 601, and is formed between the recess and the flow path cover 631.

The refrigerant passes from the inlet flow path 606' through the fifth flow path 650 and flows through the first and second cooling members 110 and 120 in the direction of arrow A in the drawing. Thereafter, the refrigerant passes through the sixth flow path 660, flows through the seventh flow path 670 in the direction of arrow B in the drawing, and reaches the outlet flow path 607'.

By forming the flow path in this manner, the smoothing capacitor 400 can be cooled. Then, the control circuit board 700*b* disposed facing the smoothing capacitor 400 is also cooled. Furthermore, since the housing 600 is also cooled, the cooling effect inside the power conversion device 1000 is enhanced, the influence of the temperature of the components can be reduced, and the reliability is improved.

Figure 13:
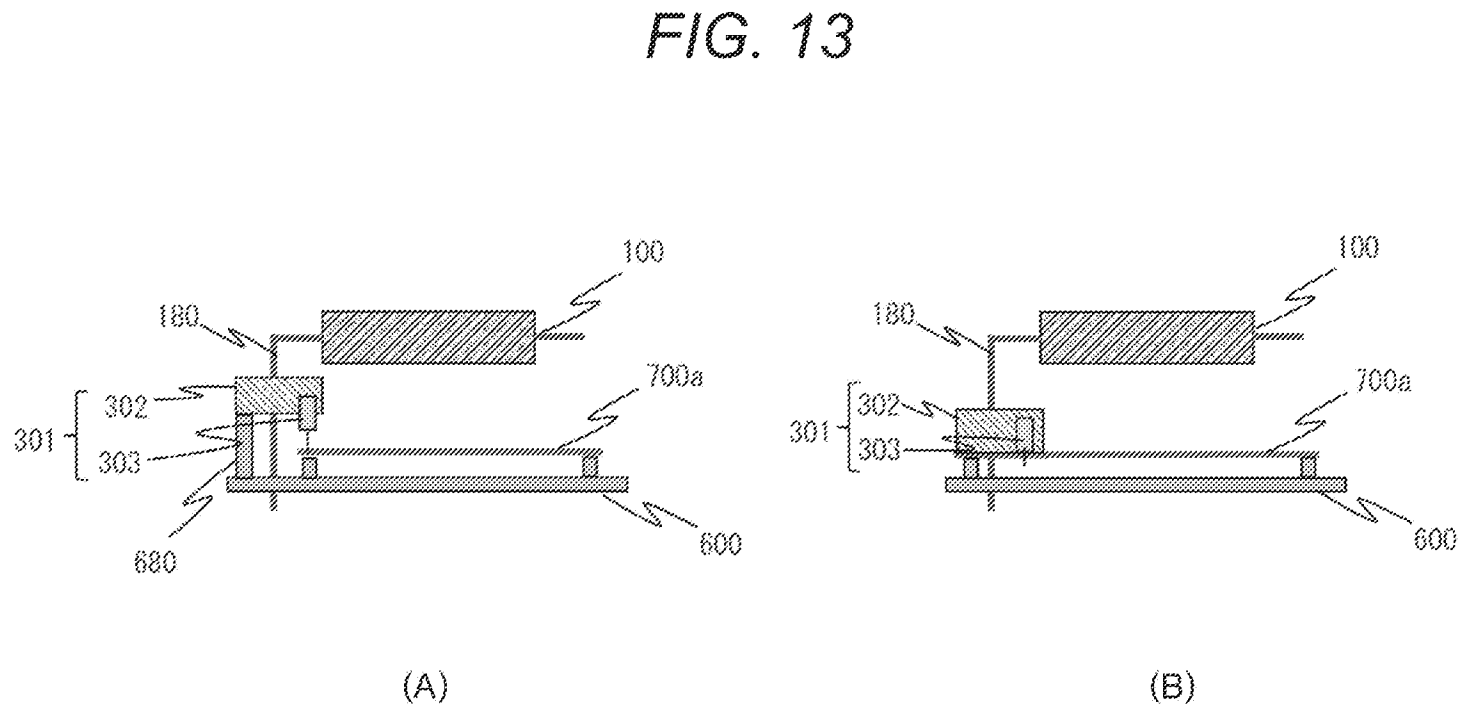

FIGS. 13(A) and 13(B) are diagrams illustrating installation modes 1 and 2 of a current sensor 301. FIG. 13(A) illustrates an installation mode 1, and FIG. 13(B) illustrates an installation mode 2. Both are side views when viewed from the arrangement direction of the semiconductor modules 100.

The current sensor 301 is installed in the vicinity of an output line 180 between the semiconductor module 100 and the AC bus bar 300, and is connected to the drive circuit board 700*a*. The current sensor 301 includes a U-shaped core 302 and an IC 303 that measures the magnitude of a magnetic field generated in the core 302.

In the installation mode 1 illustrated in FIG. 13(A), the core 302 is disposed in a boss 680 protruding from the housing 600, the IC 303 is disposed in the U-shaped portion of the core 302, and the detection line from the IC 303 is connected to the drive circuit board 700*a*.

In the installation mode 2 illustrated in FIG. 13(B), the core 302 is disposed on the drive circuit board 700*a*, the IC 303 is disposed in the U-shaped portion of the core 302, and the detection line from the IC 303 is connected to the drive circuit board 700*a*.

Figure 14:
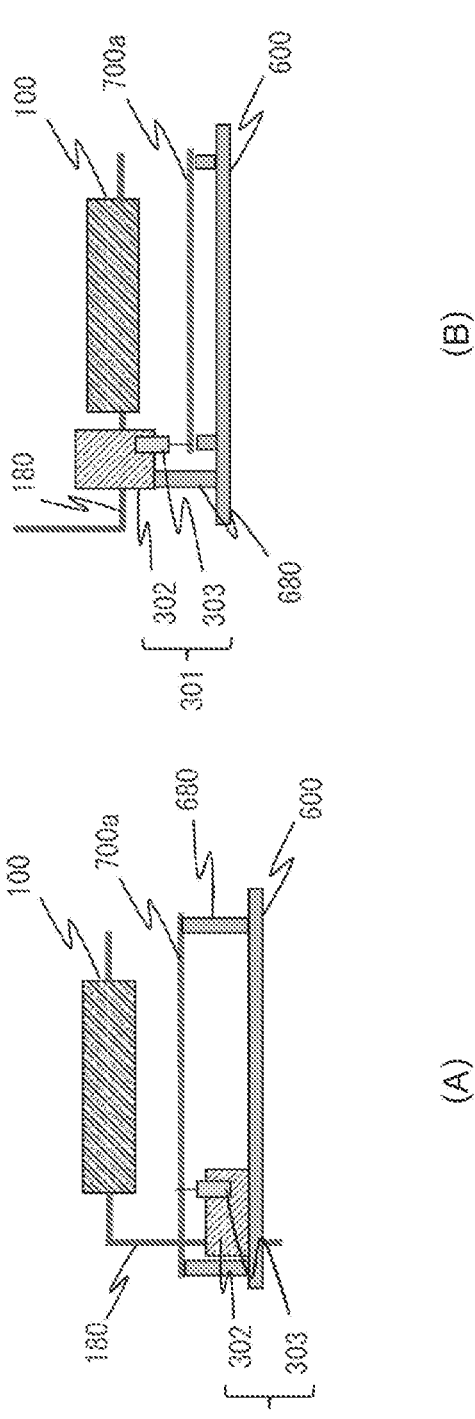
FIGS. 14(A) and 14(B) are diagrams illustrating installation modes 3 and 4 of the current sensor.

FIGS. 14(A) and 14(B) are diagrams illustrating installation modes 3 and 4 of the current sensor 301. FIG. 14(A) illustrates an installation mode 3, and FIG. 14(B) illustrates an installation mode 4. Both are side views when viewed from the arrangement direction of the semiconductor modules 100.

In the installation mode 3 illustrated in FIG. 14(A), the drive circuit board 700*a* is installed on the boss 680 protruding from the housing 600, and a space is provided between the drive circuit board 700*a* and the housing 600. In this space, the core 302 is disposed in the housing 600, the IC 303 is disposed in the U-shaped portion of the core 302, and the detection line from the IC 303 is connected to the drive circuit board 700*a*.

In the installation mode 4 illustrated in FIG. 14(B), an installation example in a case where the output line 180 from the semiconductor module 100 is led out in a direction opposite to the position of the drive circuit board 700*a* is illustrated. The core 302 is disposed in the boss 680 protruding from the housing 600, the IC 303 is disposed in the U-shaped portion of the core 302, and the detection line from the IC 303 is connected to the drive circuit board 700*a*.

According to the installation modes 1 to 4, since the current sensor circuit that has received the detection signal from the IC 303 of the current sensor 301 can be included in the drive circuit board 700*a*, it is possible to reduce the size and cost of the current sensor 301. In addition, since the current sensor 301 is installed on the drive circuit board 700*a* or the like, a member or the like for installing the current sensor 301 can be omitted. Furthermore, although the core 302 of the current sensor 301 is heavy, since it is installed on the housing 600, the boss 680 protruding the housing 600, and the drive circuit board 700*a*, it is possible to increase the installation stability of the current sensor 301. Note that a detection signal from the current sensor 301 installed on the drive circuit board 700*a* is transmitted to the control connector 703 via the wiring pattern on the drive circuit board 700*a*, and is transmitted from the control connector 703 to the control circuit board 700*b*.

Figure 15:
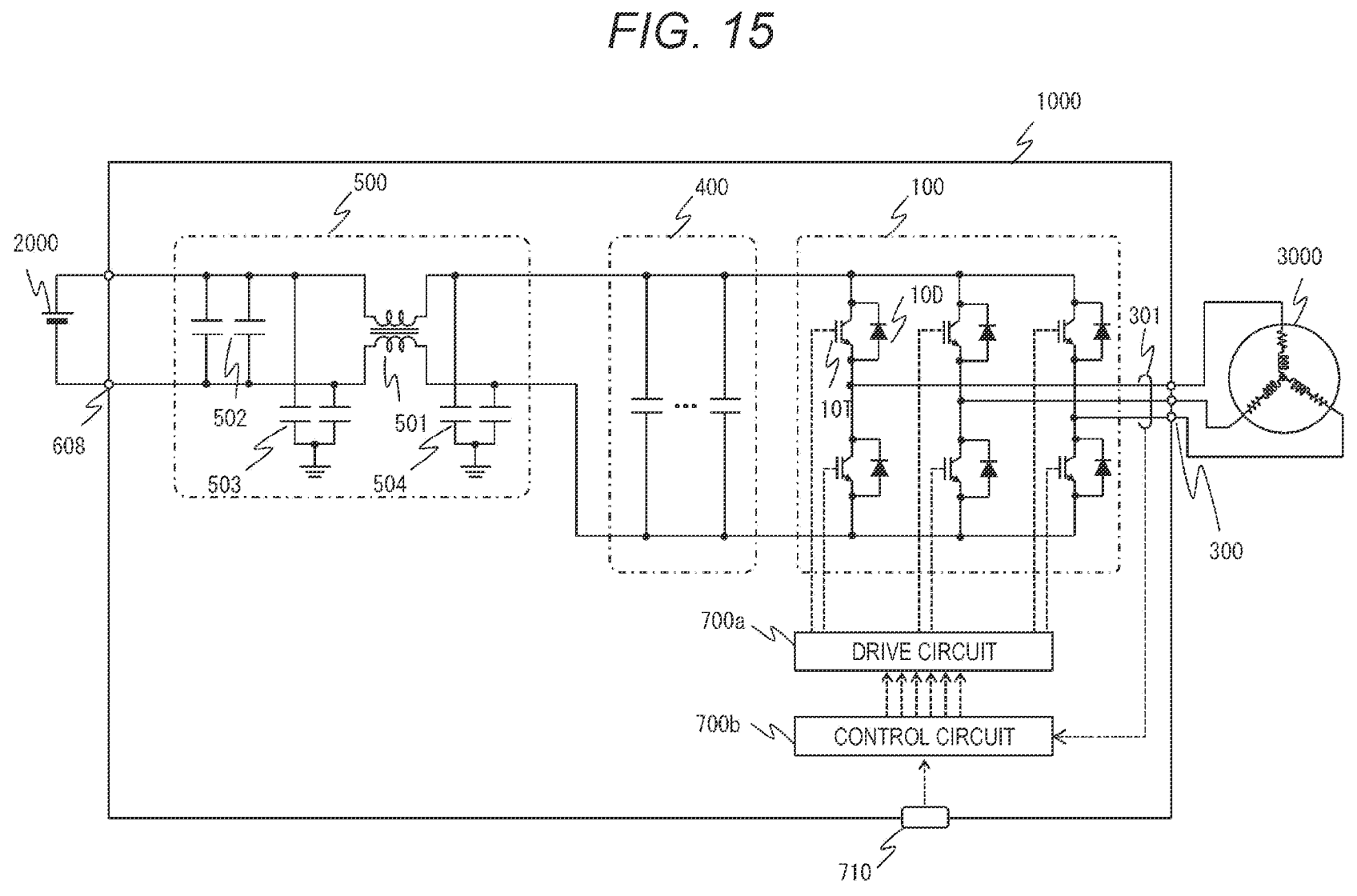

FIG. 15 is a circuit configuration diagram of the power conversion device 1000.

The power conversion device 1000 converts DC power supplied from the battery 2000 via the DC input unit 608 into AC power, and outputs an AC current to the AC bus bar 300. The output AC current is supplied to the motor 3000 to drive the motor 3000.

The power conversion device 1000 includes an EMC filter 500, a smoothing capacitor 400, a semiconductor module 100, and a drive circuit board 700*a*. The first and second cooling members 110 and 120, the third flow path 630, the fourth flow path 640, and the like disposed on both surfaces of the semiconductor module 100 are not illustrated.

The EMC filter 500 is connected to the positive electrode wiring and the negative electrode wiring from the battery 2000. The EMC filter 500 includes a magnetic filter core 501 surrounding a DC wiring including a positive electrode wiring and a negative electrode wiring, an X capacitor 502 and a Y capacitor 503 connected to the DC wiring at a preceding stage of the filter core 501, and a Y capacitor 504 connected to the DC wiring at a subsequent stage of the filter core 501. The Y capacitors 503 and 504 are connected between the positive electrode wiring line and GND and between the negative electrode wiring line and GND. The Y capacitors 503 and 504 and the filter core 501 reduce common mode noise. The X capacitor 502 reduces normal mode noise. In order to suppress high voltage conduction noise in a wide frequency band, two capacitors connected in parallel and having different capacitances are generally used.

The smoothing capacitor 400 is connected to the positive electrode wiring and the negative electrode wiring from the EMC filter 500. The smoothing capacitor 400 smooths a DC voltage applied to the semiconductor module 100 by suppressing a ripple voltage and a ripple current generated in a DC wiring which is a bus bar connected to a DC high voltage during a switching operation of a semiconductor element in the semiconductor module 100.

The semiconductor module 100 is connected to the positive electrode wiring and the negative electrode wiring (DC bus bar) from the smoothing capacitor 400. The semiconductor module 100 has a semiconductor element sealed in the semiconductor module 100. An insulated gate bipolar transistor is used as the semiconductor element, and is hereinafter referred to as an IGBT. An IGBT 10T and a diode 10D operating as the upper arm and an IGBT 10T and a diode 10D operating as the lower arm constitute a series circuit of the upper and lower arms. One semiconductor module 100 includes this series circuit of upper and lower arms. The entire semiconductor module 100 includes three semiconductor modules 100 corresponding to three phases of a U phase, a V phase, and a W phase of AC power. The collector electrode of the IGBT 10T of the upper arm is electrically connected to the terminal on the positive electrode side of the smoothing capacitor 400 via the positive electrode terminal. An emitter electrode of the IGBT 10T in the lower arm is electrically connected to the terminal on the negative electrode side of the smoothing capacitor 400 via the negative electrode terminal. Then, an inverter circuit is configured using the three semiconductor modules 100, and a series circuit of upper and lower arms of each of the three phases outputs an AC current from an intermediate electrode which is a midpoint portion of the series circuit from the AC bus bar 300. The current sensor 301 is provided in the vicinity of the output line of each phase of the AC bus bar 300. Note that a metal oxide semiconductor effect field transistor (hereinafter, referred to as a MOSFET) may be used as the semiconductor element. In this case, the diode 10D is unnecessary.

Electronic components constituting a drive circuit are mounted on the drive circuit board 700*a*, and electronic components constituting a control circuit are mounted on the control circuit board 700*b*. The control circuit receives a control command from the host control device via the signal connector 710. The control circuit includes a microcomputer for calculating the switching timing of the IGBT 10T. A current value detected by the current sensor 301 and a magnetic pole position from a rotating magnetic pole sensor (not illustrated) such as a resolver provided in the motor 3000 are input to the microcomputer. Although not illustrated, the current value detected by the current sensor 301 is transmitted to the control circuit board 700*b* via the wiring pattern on the drive circuit board 700*a*. The microcomputer generates a control pulse for controlling the IGBT 10T constituting the upper arm or the lower arm of the series circuit of each phase constituting the inverter circuit based on the current value, the magnetic pole position, and the target torque value from the host control device, and supplies the control pulse to the drive circuit on the drive circuit board 700*a*.

The drive circuit on the drive circuit board 700*a* supplies a drive pulse for driving the IGBT 10T constituting the upper arm or the lower arm of the series circuit of each phase to the IGBT 10T of each phase based on the control pulse generated by the control circuit. The drive circuit may use a transformer 705 for voltage conversion (see FIG. 11) to drive the IGBT 10T. The IGBT 10T performs conduction or cutoff operation based on the drive pulse from the drive circuit, converts DC power supplied from the battery 2000 into three-phase AC power, and drives the motor 3000 with the converted power.

According to the above embodiment, the following operational effects are obtained.

(1) A power conversion device 1000 includes: a semiconductor module 100 in which a semiconductor element is sealed; a drive circuit board 700*a* on which a drive circuit that drives the semiconductor element is mounted; a control circuit board 700*b* on which a control circuit that controls the drive circuit is mounted; and a first cooling member 110 that cools the semiconductor module 100. The power conversion device 1000 is divided into a first space 604 and a second space 605 by a partition wall 601 of a housing 600. The drive circuit board 700*a* is disposed in the first space 604 so as to face the semiconductor module 100 with the first cooling member 110 interposed between the drive circuit board 700*a* and the semiconductor module 100. The control circuit board 700*b* is disposed in the second space 605. As a result, it is possible to suppress the influence of noise due to the switching operation of the semiconductor element on the drive circuit and the control circuit.

The present invention is not limited to the above embodiments, and includes other forms considered within the scope of the technical ideas of the present invention as long as the features of the present invention are not degraded. In addition, the above embodiments and the plurality of modifications may be combined.

REFERENCE SIGNS LIST

100 semiconductor module
101 control terminal
101*b* cooling surface
102 AC terminal
110 first cooling member
120 second cooling member
130 spring plate member
131 leg portion
135 clip portion
140 base plate
141 attachment hole
142 positioning hole
143 first locking portion
144 second locking portion
145 control terminal opening
180 output line
300 AC bus bar
301 current sensor
400 smoothing capacitor
500 EMC filter
501 filter core
502 X capacitor
503 Y capacitor
600 housing
601 partition wall
602 side wall
603 arrangement hole
604 first space

605 second space
606, 606' inlet flow path
607, 607' outlet flow path
609 wiring hole
610 lower cover (first lid)
620 upper cover (second lid)
630 third flow path
631 flow path cover
632 cooling seat
640 fourth flow path
650 fifth flow path
660 sixth flow path
670 seventh flow path
700*a* drive circuit board
700*b* control circuit board
705 transformer
710 signal connector
1000 power conversion device
2000 battery
3000 motor
10T IGBT
10D diode

The invention claimed is:

1. A power conversion device comprising:
a semiconductor module in which a semiconductor element is sealed;
a drive circuit board on which a drive circuit that drives the semiconductor element is mounted;
a control circuit board on which a control circuit that controls the drive circuit is mounted;
a first cooling member that cools the semiconductor module; and
a smoothing capacitor that smooths a DC voltage applied to the semiconductor module,
wherein the power conversion device is divided into a first space and a second space by a partition wall of a housing,
wherein the drive circuit board is disposed in the first space so as to face the semiconductor module with the first cooling member interposed between the drive circuit board and the semiconductor module,
wherein the control circuit board is disposed in the second space,
wherein the smoothing capacitor is disposed on a side portion of the semiconductor module and the drive circuit board,
wherein the control circuit board is disposed at a position facing the smoothing capacitor across the partition wall when viewed from a direction perpendicular to the partition wall of the housing,
wherein at least a partial region of the control circuit board is disposed at a position overlapping the drive circuit board in a direction perpendicular to a main surface of the control circuit board, and
wherein a wiring hole through which connection wiring passes between the control circuit board and the drive circuit board is formed in the region in the partition wall.

2. The power conversion device according to claim 1, comprising:
the housing that includes the partition wall and a side wall formed around the partition wall;
a first lid that forms the first space between the first lid and the partition wall; and
a second lid that forms the second space between the second lid and the partition wall.

3. The power conversion device according to claim 1, wherein the partition wall facing the drive circuit board not including the region forms an outer wall of the housing.

4. The power conversion device according to claim 1, comprising a second cooling member disposed on a side opposite to the first cooling member across the semiconductor module.

5. The power conversion device according to claim 4, wherein the housing includes a third cooling member that cools the smoothing capacitor.

6. The power conversion device according to claim 1, wherein the housing has an inlet flow path and an outlet flow path connected to the first cooling member, and the drive circuit board is disposed between the inlet flow path and the outlet flow path.

7. The power conversion device according to claim 1, comprising a current sensor that detects a current output from the semiconductor module, wherein the current sensor is connected to the drive circuit board.

8. The power conversion device according to claim 1, wherein the drive circuit board includes a transformer for voltage conversion, and the transformer is disposed on a surface of the drive circuit board opposite to the first cooling member.

9. The power conversion device according to claim 8, wherein a protrusion that accommodates the transformer in the first space is formed on the partition wall.

\* \* \* \* \*